(12) United States Patent
Uzoh

(10) Patent No.: US 6,258,707 B1
(45) Date of Patent: Jul. 10, 2001

(54) TRIPLE DAMASCENCE TUNGSTEN-COPPER INTERCONNECT STRUCTURE

(75) Inventor: Cyprian E. Uzoh, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/227,010

(22) Filed: Jan. 7, 1999

(51) Int. Cl.[7] .............................................. H01L 21/4763
(52) U.S. Cl. .......................... 438/618; 438/622; 438/640; 438/643; 438/648; 438/656; 438/675
(58) Field of Search .................... 438/653, 654, 438/656, 618, 622, 627–629, 643, 644, 648, 688, 685, 675, 640, 665; 257/760

(56) References Cited

U.S. PATENT DOCUMENTS

| | | |
|---|---|---|
| 4,661,416 | 4/1987 | Mizuhara . |
| 4,744,858 * | 5/1988 | McDavid et al. .................... 438/665 |
| 4,814,049 | 3/1989 | Helton et al. . |
| 4,902,377 * | 2/1990 | Berglund et al. .................... 438/640 |
| 4,931,144 * | 6/1990 | Brighton ................................ 174/262 |
| 5,071,518 | 12/1991 | Pan . |
| 5,098,860 | 3/1992 | Chakravorty et al. . |
| 5,106,461 | 4/1992 | Volfson et al. . |
| 5,109,267 * | 4/1992 | Koblinger et al. ................... 257/760 |
| 5,213,638 | 5/1993 | Mahulikar et al. . |
| 5,308,796 | 5/1994 | Feldman et al. . |
| 5,320,689 | 6/1994 | Mahulikar et al. . |
| 5,385,661 | 1/1995 | Andricacos et al. . |
| 5,702,982 * | 12/1997 | Lee et al. ............................. 438/620 |
| 5,985,759 * | 11/1999 | Kim et al. ............................ 438/653 |
| 5,994,775 * | 11/1999 | Zhao et al. ........................... 257/751 |
| 6,028,008 * | 2/2000 | Bayer et al. ......................... 438/734 |

FOREIGN PATENT DOCUMENTS 64-64338   3/1989   (JP) .

* cited by examiner

Primary Examiner—Stephen D. Meier
Assistant Examiner—Maria Guerrero
(74) Attorney, Agent, or Firm—Ratner & Prestia; Tiffany L. Townsend, Esq.

(57) ABSTRACT

A structure and process for a triple damascene interconnection device. The device is formed within a terraced trench formed using damascene techniques within a single, relatively thick dielectric film. The interconnection device formed within the terraced structure includes a plurality of films and is a vertically coherent, redundant structure.

34 Claims, 7 Drawing Sheets

TRIPLE DAMASCENCE TUNGSTEN-COPPER INTERCONNECT STRUCTURE

FIELD OF THE INVENTION

The present invention is directed to the structure and formation of an interconnect device used in the semiconductor industry. More particularly, the present invention is directed to a triple damascene interconnection device formed within a dielectric material on a semiconductor substrate.

BACKGROUND OF THE INVENTION

In modern semiconductor processing technology, when an interconnection device having a high average aspect ratio is needed within a relatively thick insulating film, three discrete processing sequences are commonly used to is form three separate insulating films and separate interconnection devices within each insulating film. The individually formed interconnection devices are stacked on top of one another in order to contact each another. The repeating sequence of processing steps used to form such a structure using conventional processes is illustrated in FIG. 1A through FIG. 1F.

When forming an interconnect device in a relatively thick insulating film such as a dielectric film, individual layers (each containing dielectric material and a portion of the interconnection device) must be formed separately. For each layer, a dielectric film is deposited. The dielectric film is patterned to form an opening; the patterning material such as photoresist is removed; a barrier film is deposited within the opening and on top of the dielectric film; a bulk conductive film is deposited over the barrier layer; then, the structure is polished to remove the overburden of the interconnect materials from the upper surface of the dielectric layer. Next, another layer of dielectric material is formed and the process is repeated. Later, a third layer of dielectric material is formed and the process is again repeated.

Now turning to FIG. 1A, a contact film 3 is formed over substrate 1. The first dielectric film 5 is formed over contact layer 3. The first dielectric film 5 is patterned then etched to provide an opening 2 within the first dielectric film 5. A barrier film 12 is formed over the structure, and then conductive film 11 is formed over the barrier film 12. Portions of films 11 and 12 which lie above upper surface 8 of first dielectric film 5 are then planarized by polishing.

Now turning to FIG. 1B, the structure is shown after the connection device is formed within first dielectric film 5. Polishing processes are used to form a substantially smooth top surface 8'. Top surface 8' forms the upper surface of a section which will be the bottom section of the completed interconnection device.

FIG. 1C shows the structure after a second dielectric film 7 has been formed over the first dielectric film 5. After an opening 4 is formed within the second dielectric film 7, a barrier film 14 and a conductive film 13 are sequentially deposited in a manner similar to barrier film 12 and conductive film 11 as in FIG. 1A. The process sequence is continued with polishing and the result can be seen in FIG. 1D.

Now turning to FIG. 1E, a third dielectric film 9 is formed. Third dielectric film 9 is patterned to form opening 6. Opening 6 is filled with barrier film 16 and conductive film 15, deposited in sequence, after the patterning material has been removed.

Now turning to FIG. 1F, the final structure formed using conventional processes is shown having an upper surface 17. The layered dielectric film consists of three distinctly deposited dielectric films 5, 7, and 9, formed over contact film 3. The barrier layers 12, 14, and 16 are all separately formed. Conductive films 11, 13, and 15 are also all individually formed. Each dielectric film 5, 7, and 9 must be separately patterned to form corresponding openings 2, 4, and 6 into which corresponding portions of the interconnect device will be formed. The patterning material such as photoresist must be removed each time. Each dielectric film 5, 7, and 9 must be individually polished. The device formed using conventional processes requires several steps as well as extra materials. For example, the conductive and barrier films are each deposited three times, and the overburden of these materials is also removed three times, adding material expenses.

Barrier films 12, 14, and 16 include horizontal components which isolate portions of the conductive films 11, 13, and 15 from each other. This horizontal interface between conductive portions of the film causes current crowding which is undesirable. When current is passed through an interconnection device, it is generally desirable to spread the current across the area of the device, so as to minimize current crowding effects such as electromigration failures. The horizontal interface also increases contact resistance because the barrier materials have a much higher resistivity than the bulk conductive films.

Even with the above shortcomings such as additional processing steps and the resulting horizontal interfaces of barrier materials, the use of individually formed sections of an integrated interconnection device may be required when an opening with a high aspect ratio must be filled, because of the limitations of conventional processing technology. The aspect ratio of a device is defined as the height divided by the width. A very narrow interconnection device formed within a relatively deep dielectric film has a high aspect ratio.

When such a structure is required, the limitations of conventional processing technology require that these openings be individually formed within films which are individually deposited to form discrete layers. These discrete layers are stacked to combine to form an overall high-aspect ratio interconnection device. These process steps are necessary because of the difficulty of forming a very deep opening within a dielectric film, and subsequently filling the opening completely with interconnection materials, using conventional processing technology.

SUMMARY OF THE INVENTION

The present invention addresses the shortcomings of contemporary processing technology. It provides a process for forming a terraced trench containing multiple vertical sections within a relatively thick dielectric material without the need to separately form and pattern individual layers of dielectric films. Another aspect of the present invention is a process for forming an interconnection device within such a terraced trench having a relatively high aspect ratio by using one series of sequential film deposition processes followed by a single polishing process. The present invention produces a vertically coherent, continuous, and symmetric interconnection structure within a terraced trench opening.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1A shows the first layer of films formed;

FIG. 1B shows the structure after it has been polished;

FIG. 1C shows a second layer of films formed;

FIG. 1D shows the structure after the second layer of films has been polished;

FIG. 1E shows a third layer of films formed; and

FIG. 1F shows the completed conventional structure after it has been polished;

DETAILED DESCRIPTION

Figure 1A:
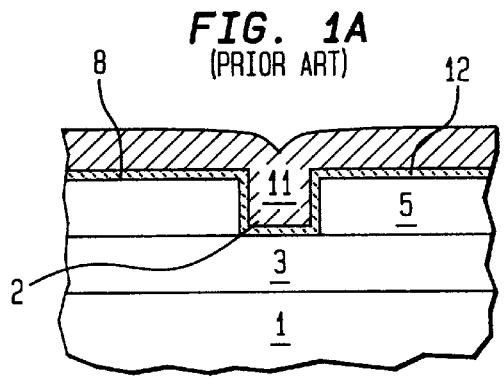
FIGS. 1A through 1F are cross-sectional views showing the conventional process sequence used to form a comparable structure. More specifically.
Figure 1B:
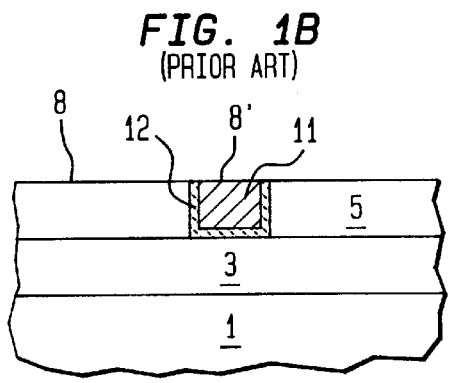
Figure 1C:
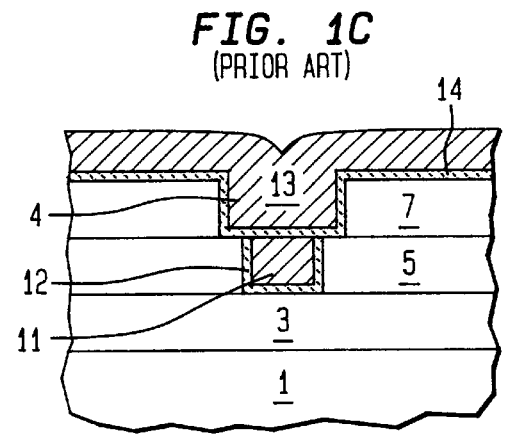
Figure 1D:
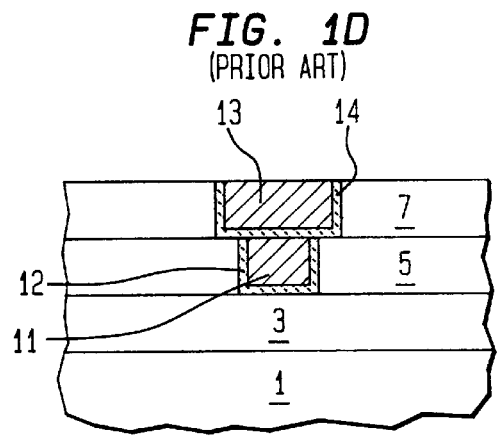
Figure 1E:
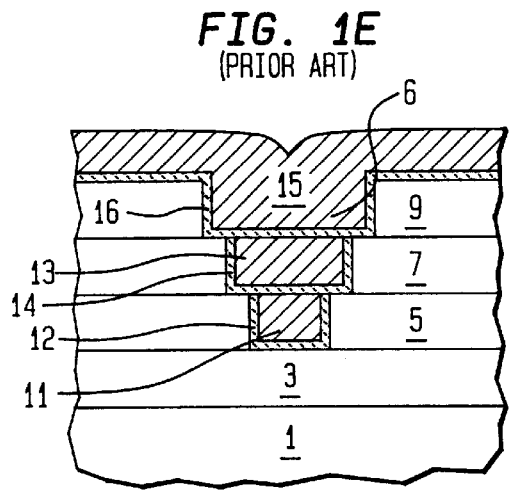
Figure 1F:
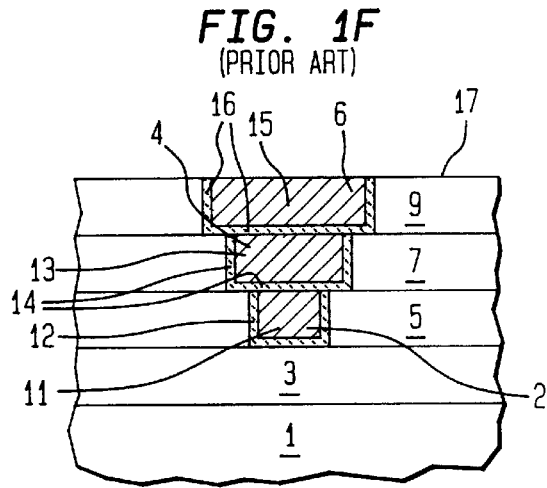
Figure 2:
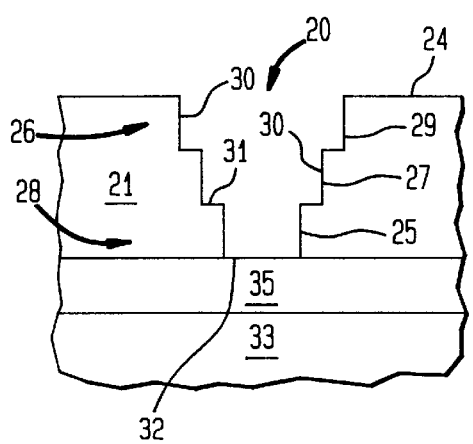
FIG. 2 is a cross section showing a terraced trench having three vertical sections.

The processes used to form the structure of the present invention can be best described in conjunction with the drawing. FIG. 2 is a cross section showing a terraced trench of the present invention before it has been filled with a vertically coherent interconnect film structure also formed according to the present invention. In FIG. 2, three terraced sections are shown; a greater or fewer number of sections may be formed, however, within the terraced trench. The present invention provides a number of processes for forming the structure as shown in FIG. 2, and also a plurality of sequences used to fill the structure to produce different embodiments of the interconnection device formed according to the present invention.

In FIG. 2, a contact film 35 is formed on a substrate 33. Over the contact film 35, a single, thick dielectric film 21 is formed. As pictured in the terraced trench having three vertical sections, the dielectric film 21 includes lower vertical section 25, middle vertical section 27, and upper vertical section 29. A trench 20 is formed within the dielectric film 21. The trench 20 has side walls 30 and lip sections 31 providing a horizontal component to side walls 30.

Generally speaking, the trench 20 includes a top 26 and a bottom 28. In the preferred embodiment, the bottom 28 of the trench 20 exposes a surface of contact film 35 which forms trench bottom surface 32. In the preferred embodiment, contact film 35 is a conductive film. The structure also has an upper surface 24. The basic structure shown in FIG. 2 may be formed according to the process sequence shown in FIGS. 3A through 3F or, alternatively, as shown in the process sequence depicted in FIGS. 4A through 4G, although each sequence provides a structure with slight variations as will be seen.

Terrace Trench Formation

The following examples are included to more clearly demonstrate the overall nature of the invention. These examples are exemplary, not restrictive, of the invention.

EXAMPLE 1

Terraced Trench Formation

Figure 3A:
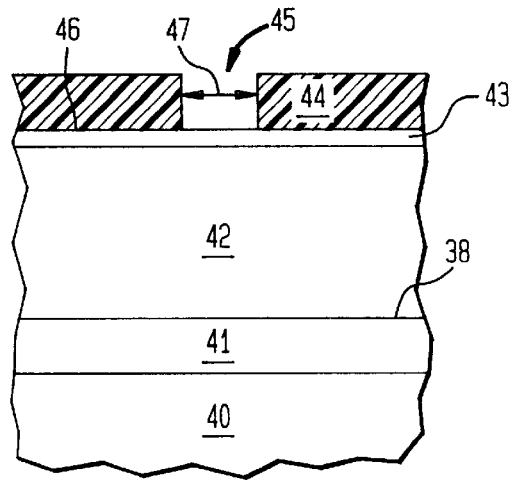
FIGS. 3A, 3B, 3C, 3D, 3E, and 3F are cross sections showing an exemplary embodiment of a process sequence for forming a terraced trench having three vertical sections according to the present invention.

FIG. 3A shows a contact film 41 formed over a substrate 40. In the preferred embodiment, substrate 40 is a semiconductor wafer used to form integrated circuit devices in the semiconductor industry. Over-the surface 38 of contact film 41, a thick dielectric film 42 is formed. The dielectric film 42 may have a thickness as large as 20,000 Angstroms or greater. The dielectric film 42 may be formed using any process suitable in the art and may comprise a silicon oxide film in the preferred embodiment. In an alternative embodiment, dielectric film 42 may be formed of other materials which have a dielectric constant which is lower than that of silicon oxide, for example, fluorinated dielectric films.

A capping film 43 has a top surface 46 and is formed over the dielectric film 42. Capping film 43 acts as an etch-stop layer. In the preferred embodiment, capping film 43 may consist of a nitride film formed using plasma enhanced chemical vapor deposition (PECVD) processing. Alternatively, capping film 43 may be an alumina ($Al_2O_3$) film. The thickness of this film may vary from 500 Angstroms to 4,000 Angstroms. Alternatively, the capping is film 43 may consist of more than one distinct layer. For example, capping film 43 may consist of a composite film including both silicon nitride and $Al_2O_3$.

After the films are formed, a first pattern is created within a first photoresist film 44 formed over the top surface 46 of the capping film 43. The first pattern formed within first photoresist film 44 includes a first opening 45 having a first width 47. The first photoresist film 44 may be applied, and the photoresist pattern may be formed, using any process suitable in the art. Likewise, the photoresist material may be any suitable photoresist material common in the art.

Figure 3B:
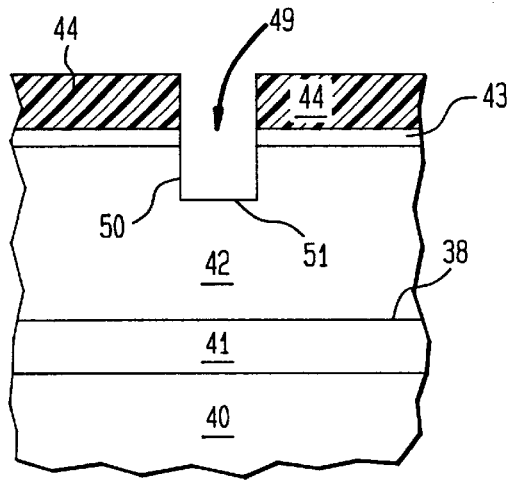
Figure 3C:
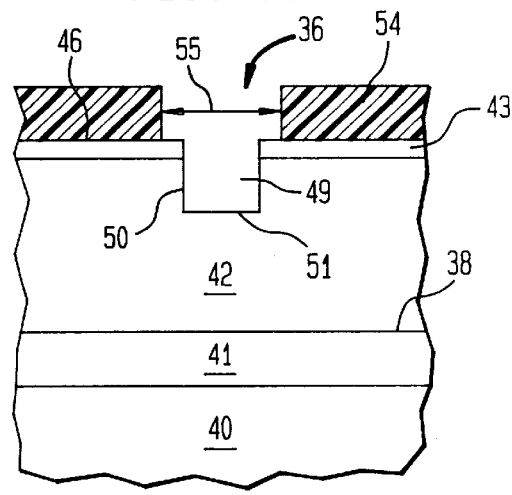

Turning to FIG. 3B, an etching procedure may be used to etch through the capping film 43 and into the dielectric film 42 to form an opening 49. In the preferred embodiment, reactive ion etching (RIE) may be used. Opening 49 may be considered a trench and has side walls 50 and a bottom surface or landing 51. After etching, the first photoresist film 44 is removed. FIG. 3C shows the next step in the processing sequence in which a second photoresist film 54 is formed over the structure. A second pattern having a second opening 36 with a second width 55 is formed within second photoresist film 54. Second width 55 is greater than first width 45 (as shown in FIG. 3A). The second opening 36 includes portions of the top surface 46 of capping film 43, as well as the bottom surface 51 of trench 49 and is centered over trench 49 in the preferred embodiment. In an alternate embodiment, the second opening may not be perfectly centered over trench 49 due to alignment errors.

Figure 3D:
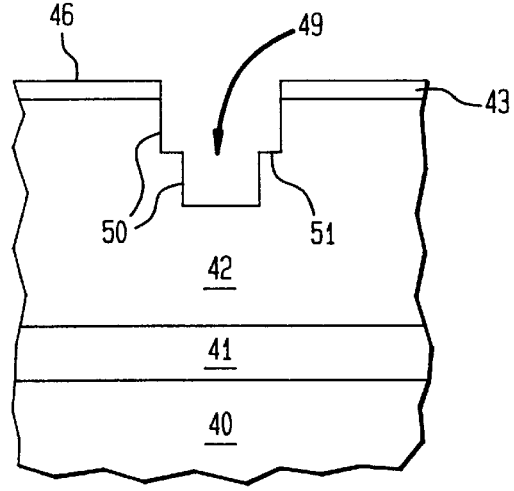

Next, an etching process is used to etch the structure down to a further depth, enlarging trench 49. The etched structure is shown in FIG. 3D after the second photoresist film 54 has been removed. The structure now has two vertical sections within enlarged trench which includes sidewalls 50 and a lip 57 forming a terraced section between the vertical sections.

Figure 3E:
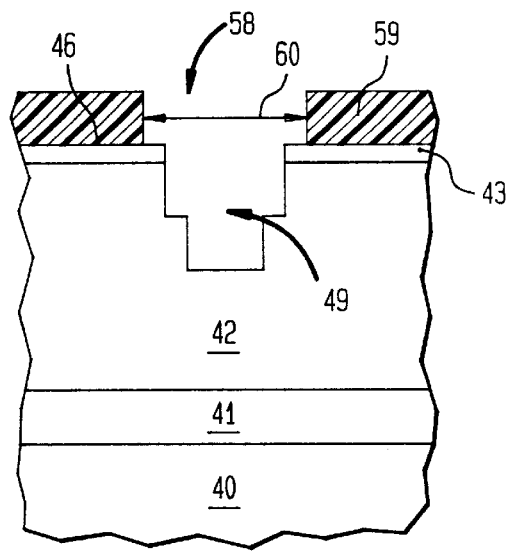

Now turning to FIG. 3E, a third pattern is formed within a third photoresist film 59. The pattern includes a third opening 58 having a third width 60 which is greater than second width 55 of second opening 36 (see FIG. 3C), which in turn is greater than first width 47 of opening 45 (see FIG. 3A). Once again, the third opening 58 exposes portions of trench 49 as well as portions of the top surface 46 of capping film 43, and can be formed using conventional processes and conventional patterning materials. In the preferred embodiment, third opening 58 is centered over trench 49.

Figure 3F:
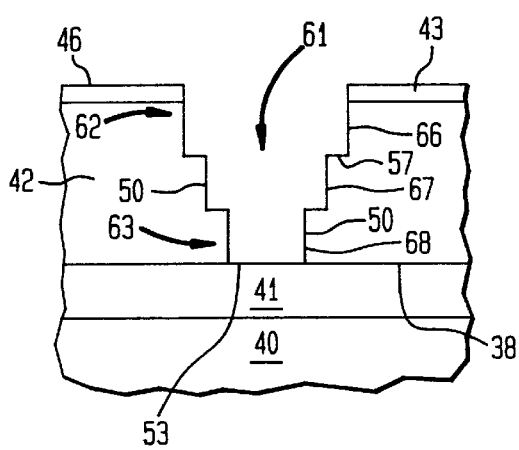

FIG. 3F shows a terraced trench formed using the process of one exemplary embodiment of the present invention. The completed trench 61 has three sections: upper vertical section 66; middle vertical section 67; and lower vertical section 68. Generally speaking, the completed trench 61 includes a top 62 and a bottom 63. In the preferred embodiment, the bottom trench surface 53 is formed by surface 38 of contact film 41 because the etch process is chosen to etch completely through dielectric film 42 and to expose portions of surface 38. Capping film 43 having a top surface 46 is included over the dielectric film 42.

The completed trench 61 itself includes side walls 50 and lip sections 57 between vertical sections 66, 67, and 68. Lip sections 57 provide a horizontal component; otherwise, the side walls 50 are generally vertical. It can be seen that the terraced completed trench 61 is comprised of a plurality of terraces or sections within a single, individually formed dielectric film 42. In the preferred embodiment, the individually created openings used to form the terraced completed trench 61 share a common center point in the cross-sectional view.

EXAMPLE 2

Terraced Trench Formation

Now turning to FIGS. 4A through 4G, an alternate exemplary embodiment is presented for the formation of a terraced trench according to the present invention. Contact film 75 is formed over substrate 69. In the preferred embodiment, substrate 69 is a semiconductor wafer used to form integrated circuit devices in the semiconductor industry. Over the top surface 78 of contact film 75, a single thick dielectric film 70 is formed. Thick dielectric film 70 may be as thick as 20,000 Angstroms or greater and as described in conjunction with FIG. 3A.

On the upper surface 88 of dielectric film 70, a first pattern is formed within a first photoresist film 72. The first pattern includes a first opening 71 having a first width 74. The first photoresist film 72 may be applied, and the photoresist pattern may be formed, using any process suitable in the art. Likewise, the photoresist material may be any suitable photoresist material common in the art.

Figure 4A:
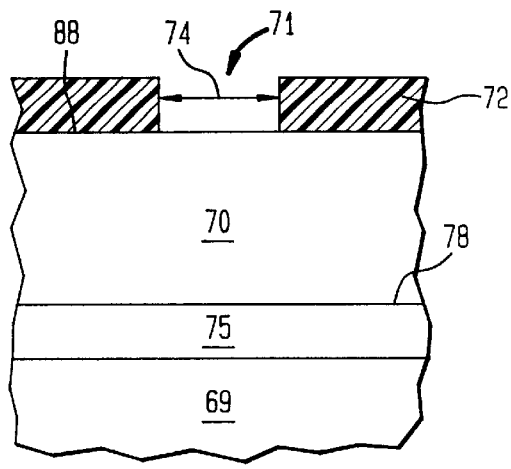
FIGS. 4A, 4B, 4C, 4D, 4E, 4F, and 4G are cross sections showing an another exemplary embodiment of a process sequence for forming a terraced trench having three vertical sections according to the present invention.
Figure 4B:
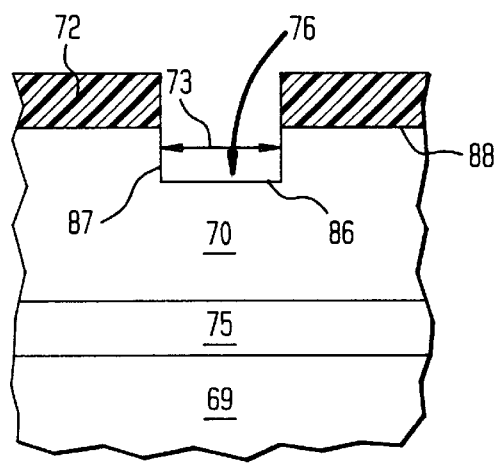

FIG. 4B shows a trench opening 76 formed within the dielectric film 70 after conventional etching processes, such as RIE, have been used to etch portions of dielectric film 70. The width 73 of the trench 76 is substantially the same as first width 74 of first opening 71 (see FIG. 4A). Trench 76 includes upper sidewalls 87 and a landing 86 which forms the bottom of the trench.

Figure 4C:
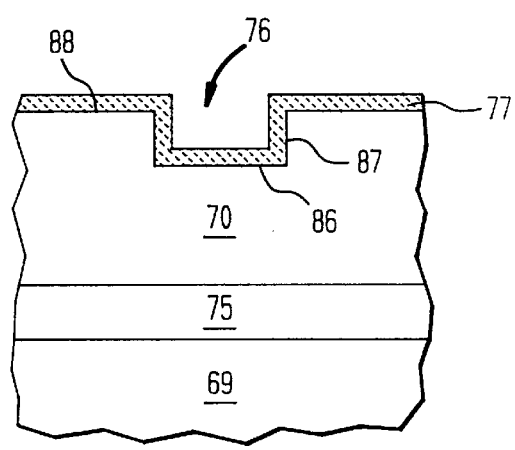

Now turning to FIG. 4C, a collar film 77 is formed within the trench 76 on upper sidewalls 87 and landing 86 and also on top of upper surface 88. The collar film 77 may consist of a layer of insulator such as silicon nitride, or multiple insulator stacks, for example $SiO_2/SiN$, $Al_2O_3/SiN$, or $Al_2O_3/SiO_2$. Alternatively, collar film 77 may comprise a thin conducting film or multiple stacks of conducting films such as titanium, tantalum, titanium tungsten, tantalum tungsten, Ti/TiN, and TaN/Ta. The function of collar film 77 is to enhance the absorption of light by photoresist, and to act as an antireflection coating. The thickness of collar film 77 may be in the range of 100 Angstroms to 2,000 Angstroms. Collar film 77 may be formed using any process for conformally depositing a film onto a surface, such as chemical vapor deposition (CVD) or physical vapor deposition (PVD). Collar film 77 may also subsequently act as a sacrificial polishing film depending on the materials used to form the film.

Figure 4D:
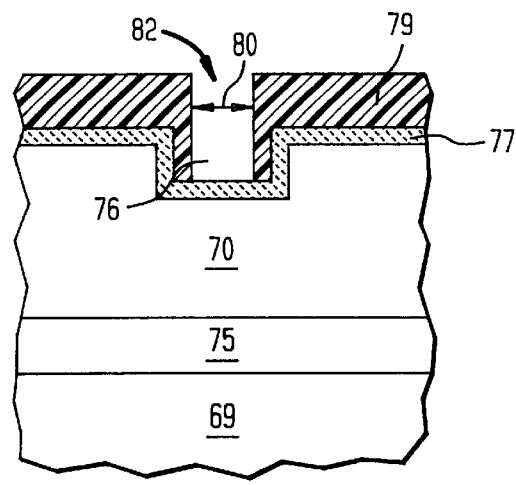
Figure 4E:
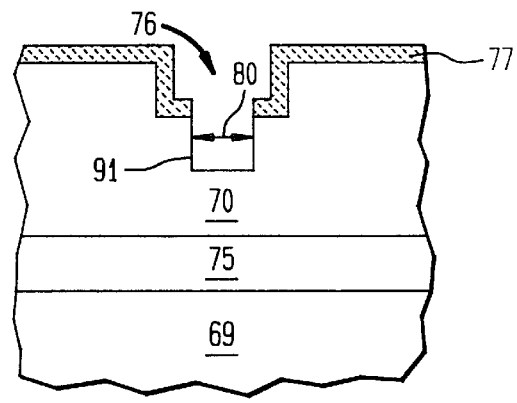

Now turning to FIG. 4D, a second photoresist pattern is formed using a second photoresist film 79. The second photoresist pattern has a second opening 82 with a second width 80 formed centered over trench 76 in the preferred embodiment. In an alternate embodiment, the second opening may not be perfectly centered due to alignment errors. Once again, the structure is etched using conventional etching processes such as RIE. The etching processes etch through the exposed portion of collar film 77, and into dielectric film 70, enlarging trench 76. The etched structure produced is shown in FIG. 4E, which illustrates trench 76 formed within the dielectric film 70 and the remaining portions of the collar film 77. The second width 80 of the second opening 82 of the second photoresist film 79 has been translated into the lower section of the trench 76 which will become the middle vertical section 91 of the completed trench.

Figure 4F:
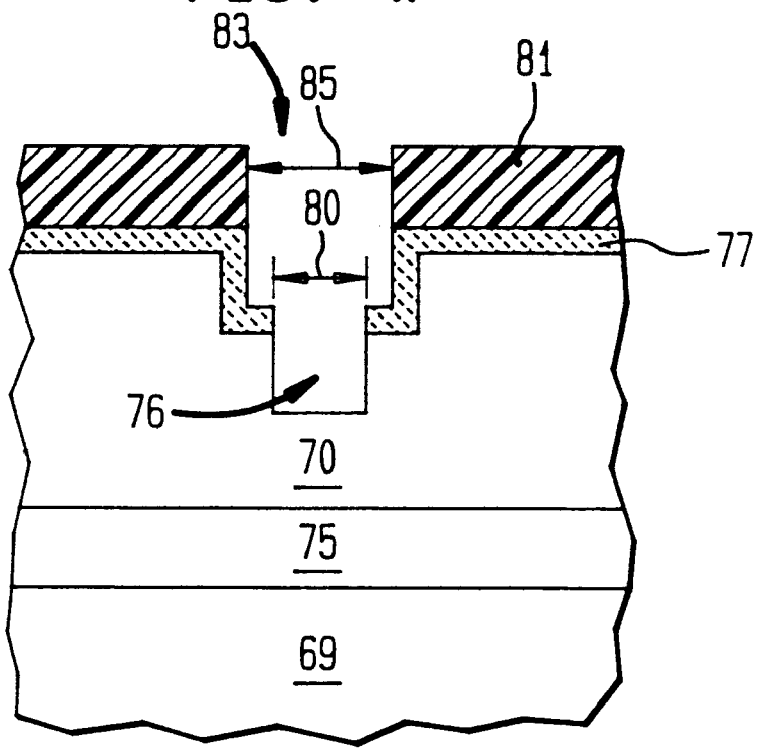

Now turning to FIG. 4F, a third pattern is formed using third photoresist film 81. The third pattern has a third opening 83 with a third width 85 which is greater than second width 80 but less than first width 74 (see FIG. 4A). Once again, the opening in the photoresist pattern is centered over trench 76 in the preferred embodiment.

Figure 4G:
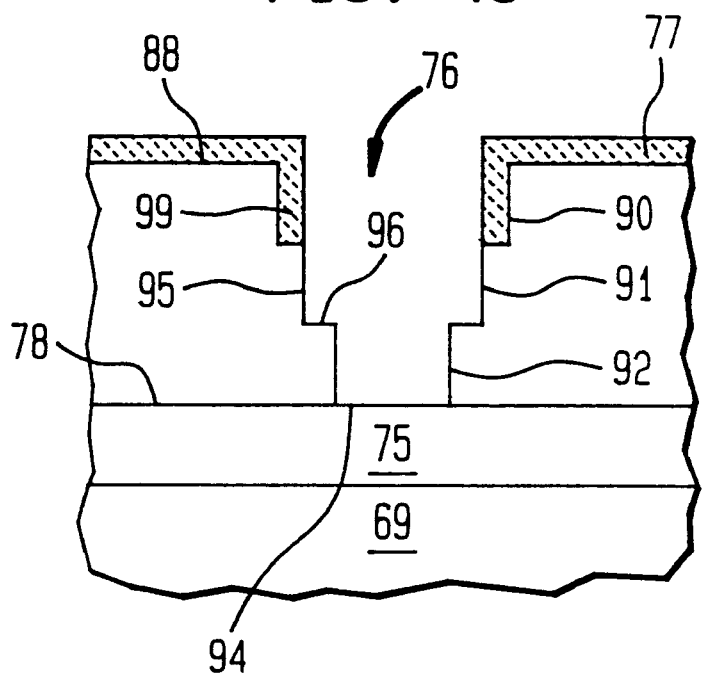

FIG. 4G is a cross section showing a terraced trench 76 comprised of three vertical sections 90 (upper), 91 (middle), and 92 (lower) formed according to the second exemplary embodiment of the present invention. Trench 76 includes side walls 95 which are generally vertical and lip sections 96 which provide a horizontal component. The trench 76 includes a trench bottom surface 94 which, in the preferred embodiment, exposes a portion of top surface 78 of contact film 75. Collar film 77 is formed above upper surface 88 of the dielectric film 70, and also includes collar section 99 formed along side walls 95 of the upper section 90 of the trench 76. The collar section 99 formed along side walls 95 serves to prevent shorting within the dielectric film and also prevents erosion of the dielectric film during subsequent polishing operations.

Interconnection Device Formation

The present invention also provides a process for forming a vertically coherent interconnection device within a structure such as the terraced trench structure formed as above. The vertically coherent interconnection device is a redundant device including a plurality of films wherein a film other than the bulk conductive film is capable of carrying current should the bulk conductive film fail.

The terraced trench, into which an-interconnection device will be introduced, may include the collar film 77 as in FIG. 4G or the capping film 43 as in FIG. 3F. For simplicity, the formation of the interconnection device will be discussed in conjunction with a terraced trench containing neither of these films, as shown in FIG. 2, although it can be understood that the interconnection device may be formed within any trench.

EXAMPLE 3

Interconnect Device Formation

Figure 5:
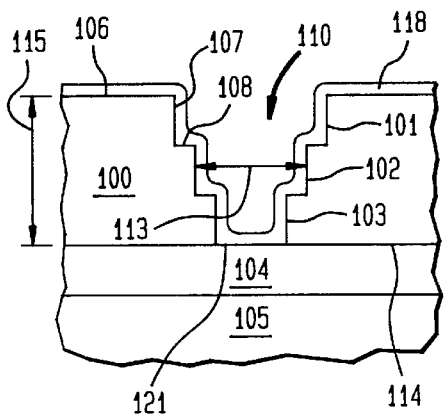
FIG. 5 is a cross section showing a terraced trench containing a barrier or adhesion film.

FIG. 5 shows a cross-sectional view of a terraced trench 110 formed having three vertical sections. The structure may be formed as above. Trench 110 is formed within thick dielectric film 100. Dielectric film 100 has a thickness or height 115. The three vertical sections of trench 110 are an upper vertical section 101, a middle vertical section 102, and a lower vertical section 103. In alternative embodiments, the terraced trench may include a fewer or greater number of vertical sections. A contact film 104 having an upper surface 114 is formed over a substrate 105. Substrate 105 may be a semiconductor wafer in the preferred embodiment. Contact film 104 may be a conductive film in the preferred embodiment.

Trench 110 includes a plurality of side walls 107 which are generally vertical, and lip sections 108 which provide a horizontal component. In the preferred embodiment, the trench bottom surface 121 exposes a section of contact film 104. The trench 110 has an aspect ratio defined as the height 115 of the trench 110 divided by the average width 113 of the trench 110. One advantage of the present invention is that a trench or opening having a high average aspect ratio of 4.2 or greater can be filled with an interconnection structure formed according to the processing sequence of the present invention.

In an exemplary embodiment, and for a triple damascene structure including three vertical sections as shown in FIG. 5, the lower vertical section 103 may be 2,500 Angstroms to 4,000 Angstroms in height; the middle vertical section 102 may be 3,000 Angstroms to 6,000 Angstroms in height, and the upper vertical section 101 may be 2,000 Angstroms to 6,000 Angstroms in height. The width of the trench 110 in lower vertical section 103 may be on the order of 1,500 to 4,000 Angstroms; the width of the trench 110 in middle vertical section 102 may be on the order of 2,000 to 4,000 Angstroms; and the width of the trench 110 in upper vertical section 101 may be on the order of 2,000 to 6,000 Angstroms. The average width of the trench 110, represented by width 113, may be on the order of 3,500 Angstroms. Therefore, with an average height 115 of dielectric film 100 of 15,000 Angstroms, the aspect ratio of trench 110 is about 4.28.

Although the process for forming the interconnect device of the present invention will be discussed with respect to a terraced trench having three vertical sections formed as described above, it is understood that the interconnection device of the present invention may also be formed within a trench structure having fewer or greater than three vertical sections. It is also understood that the dimensions and relative sizes of the features comprising the terraced trench may also be varied. In addition, the interconnection device of the present invention may be formed within a trench which does not have distinct terraced sections.

FIG. 5 shows a terraced trench 110 that includes a barrier film or adhesion film 118 formed over the top surface 106 of dielectric film 100 and over the side walls 107, lips 108, and trench bottom surface 121 of trench 110. Electroless processes, PVD processes, CVD processes, or combinations of such processes may be used to form barrier-adhesion film 118. The thickness of the barrier-adhesion film 118 may range between 10 Angstroms to 500 Angstroms, but will more typically lie between 15 to 350 Angstroms. The barrier-adhesion film 118 consists of material such as titanium nitride, hexagonal tantalum nitride, tantalum tungsten, tungsten nitride, or multiple layers of films such as TiN/Ti, Ti/TiN, Ta/TaW, TaN/Ta, or Ti/WN. Alternatively, barrier-adhesion film 118 could be formed using electroless deposition of films comprising, for example, a Pd/CoP layer.

Figure 6:
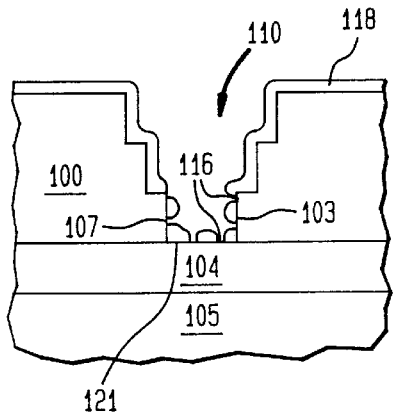
FIG. 6 is a cross section showing another exemplary embodiment of the present invention in which the barrier film is discontinuous.

In the alternative embodiment shown in FIG. 6, barrier-adhesion film 118 has discontinuous sections 116 both in the lower vertical section 103 and in the trench bottom surface 121 of the trench 110. Discontinuous sections 116 leave exposed portions of contact film 104, through trench bottom surface 121, and side walls 107 of lower vertical section 103.

Figure 7:
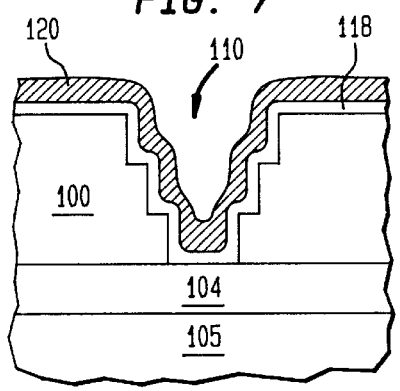
FIG. 7 is a cross section showing the device of FIG. 6 after a tungsten film has been added.

After formation of the barrier-adhesion film 118, a tungsten film 120 is formed as shown in FIG. 7. Tungsten film 120 covers the barrier-adhesion film 118 (shown as a continuous film in FIG. 7). The thickness of the tungsten film 120 may range from 100 Angstroms to 5,000 Angstroms, preferably within the range of 150 Angstroms to 3,000 Angstroms. The conformal tungsten film 120 may be formed using various processes depending on the aspect ratio of the trench 110 to be filled. In the preferred embodiment, CVD processes are used.

Figure 8:
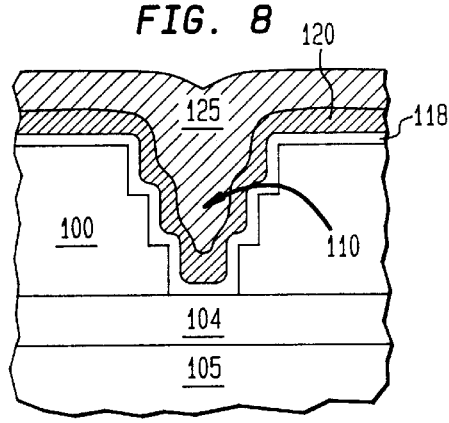
FIG. 8 is cross section showing the device of FIG. 7 after a conductive film has been added.

In a first embodiment of the interconnection device, as shown in FIG. 8, a bulk conducting film 125 is formed directly over the tungsten film 120. Bulk conducting film 125 may be copper or aluminum in the preferred embodiment. Any suitable process for deposition may be used, including sputtering in the preferred embodiment. Bulk conducting film 125 fills trench 110. FIG. 8 shows a cross section of a completed film structure of a first embodiment of the interconnection device of the present invention before polishing.

Figure 9:
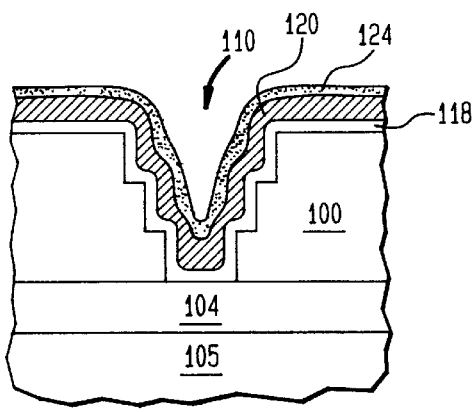
FIG. 9 is a cross section showing the device after a spacer film has been added to the structure shown in FIG. 7.

FIG. 9 shows a second embodiment of the interconnection device of the present invention, in which a spacer film 124 is formed over the tungsten film 120 shown in FIG. 7. The spacer material may be deposited by CVD or PVD processes. Spacer materials may consist of a tungsten nitride layer, titanium tungsten, or the nitride of tantalum or titanium. The thickness of the spacer film 124 may vary from 50 to 800 Angstroms, but will preferably be between 100 to 300 Angstroms. In the case of a tungsten nitride spacer film 124 as in the preferred embodiment, during the deposition of the tungsten film 120 by CVD or PVD processes, a nitrogen or ammonia gas source is introduced toward the end of the tungsten film deposition to yield a tungsten nitride film. In this manner, films 120 and 124 may be formed in-situ.

Figure 10:
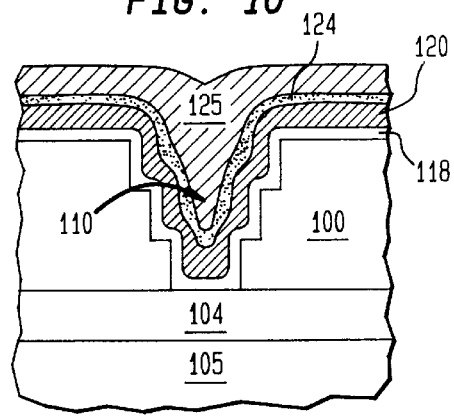
FIG. 10 is a cross section showing the device of FIG. 9 after a conductive film has been added.

In FIG. 10, the bulk conductive film 125 is formed directly over spacer film 124. As discussed in conjunction with FIG. 8, bulk conductive film 125 may be copper or aluminum and may be formed by any conventional processes known in the art. Bulk conducting film 125 fills trench 110. FIG. 10 shows a cross section of a completed film structure of a second embodiment of the interconnection device of the present invention before polishing.

Figure 11:
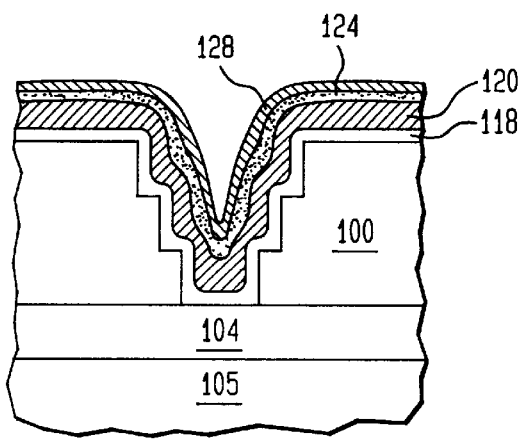
FIG. 11 is a cross section showing the device after a copper seed layer has been added to the structure shown in FIG. 9.

FIG. 11 represents a third embodiment of the interconnection device according to the present invention. In this embodiment, the bulk conductive film 125 is formed using electrodeposition processes. In FIG. 11, a copper seed layer 128 is formed over spacer film 124. The copper seed layer 128 may be formed by PVD, ionized PVD, or other processes.

Figure 12:
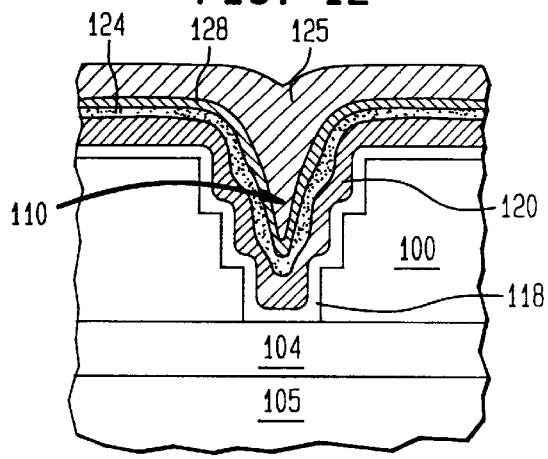
FIG. 12 is a cross section showing the device of FIG. 11 after a conductive film has been added.

FIG. 12 shows bulk conductive film 125, which is a copper film, formed over the copper seed layer 128. The copper bulk conductive film 125 may be formed using conventional electrodeposition process and completely fills trench 110. FIG. 12 shows a cross section of a completed film structure of a third embodiment of the interconnection device of the present invention before polishing.

In summary, three different exemplary embodiments have been described for the interconnection device of the present invention: the bulk conductive film 125 as configured in FIG. 8; the bulk conductive film 125 formed over a spacer film 124 as configured in FIG. 10; and the bulk conductive film 125 electrodeposited over a copper seed layer 128 as configured in FIG. 12. All three exemplary embodiments are redundant structures including a bulk conductive film and a tungsten film. The tungsten is capable of carrying a current and preventing device failure should the bulk conductive film fail due to electromigration or other problems.

Figure 13:
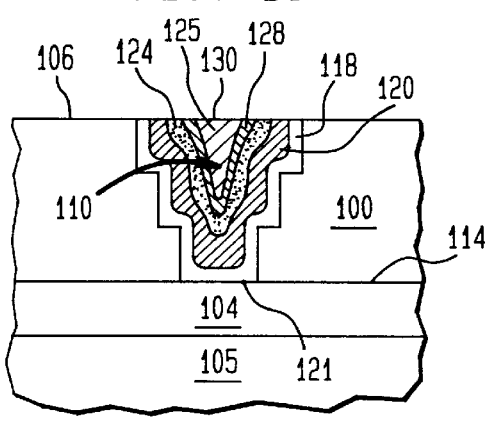
FIG. 13 is a cross section showing an exemplary embodiment of the structure of the present invention after it has been polished.

FIG. 13 shows the embodiment depicted in FIG. 12 after the structure has been polished. CMP or other polishing techniques may be used. After polishing, the top polished surface 130 of the interconnection device is substantially continuous with the top surface 106 of the dielectric film 100. The trench 110 includes trench bottom surface 121. In the preferred embodiment, the terraced trench 110 may be formed to expose upper surface 114 of contact film 104, whereby upper surface 114 includes trench bottom surface 121. In the preferred embodiment, contact film 104 may be a conductive film.

Figure 14:
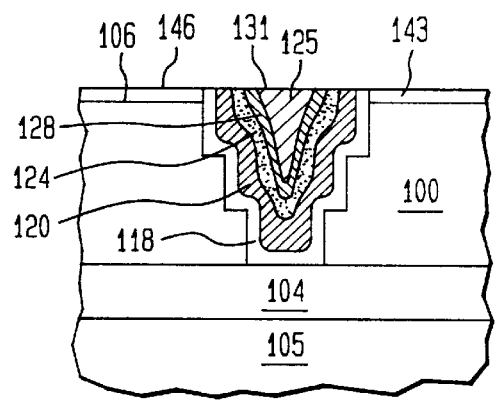
FIG. 14 is a cross section showing another exemplary embodiment of the structure of the present invention including a polishing stop film.

FIG. 14 shows another embodiment of the interconnection device which is similar to the device illustrated in FIG. 13. The device of FIG. 14 includes a capping film 143 which is similar to capping film 43 described in reference to FIGS. 3A through 3F. In this alternative embodiment, upper surface 131 of the interconnection device, although substantially parallel to top surface 106 of the dielectric film 100, lies slightly above top surface 106 and is substantially continuous with upper surface 146 of capping film 143.

EXAMPLE 4

Interconnect Device Formation with Tungsten Core

Figure 15:
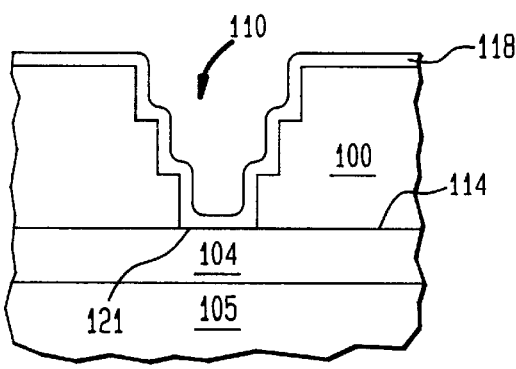
FIG. 15 shows a cross section of a terraced trench containing a barrier or adhesion film.

FIG. 15 is identical to FIG. 5. A description follows of a second example of the interconnection device formed according to the present invention and including a tungsten core. As with Example 3, the interconnection device may be formed within a trench created according to Examples 1 and 2 of the present invention, or any other trench having various physical features and dimensions.

Figure 16:
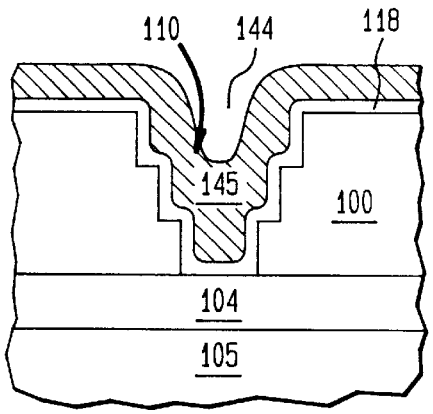
FIG. 16 is a cross section showing the structure of FIG. 15 after a bulk conductive film has been added.

In FIG. 16, a bulk conductive film 145 is formed over barrier-adhesion film 118. The barrier materials used are similar to those described in conjunction with FIG. 5. The thickness of the barrier-adhesion film 118 depends upon the dimensions of the opening, such as the terraced trench 110, into which the barrier-adhesion film 118 is deposited. In the preferred embodiment, the thickness will range from 100 to 800 Angstroms, but can range from 50 to 1,500 Angstroms.

Bulk conductive film 145 is formed over the barrier-adhesion film 118 that lines terraced trench 110. The bulk conductive film 145 only partially fills the trench 110, leaving an unfilled section 144. The unfilled section 144 will subsequently be filled with a tungsten plug. In the preferred embodiment, the bulk conductive film 145 may comprise copper or aluminum and may be formed using sputter deposition processes. In an alternate embodiment, bulk conducting film 145 may comprise gold or nickel.

In an exemplary embodiment, electrodeposition techniques may be used to form a copper bulk conductive film 145. When electrodeposition processes are used, a copper seed layer (not shown) is interposed between the barrier-adhesion film 118 and the bulk conductive film 145. The copper seed layer may be formed by any process suitable in the art. In both embodiments, the bulk conductive film 145 does not completely fill the trench 110; rather, an unfilled section 144 remains in the trench 110.

Figure 17:
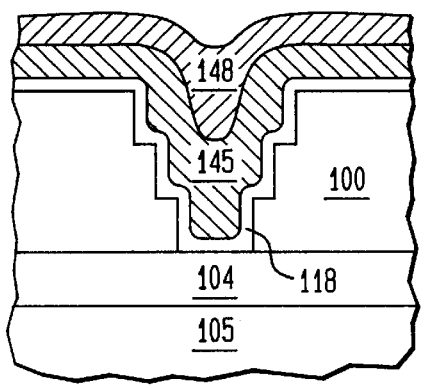
FIG. 17 is a cross section showing the structure of FIG. 16 after a tungsten film has been added.

FIG. 17 shows the structure of FIG. 16 after a tungsten film 148 has been added. The tungsten film 148 is deposited by CVD or other processes, and is of sufficient thickness to completely fill the unfilled section 144 shown in FIG. 16.

Figure 18:
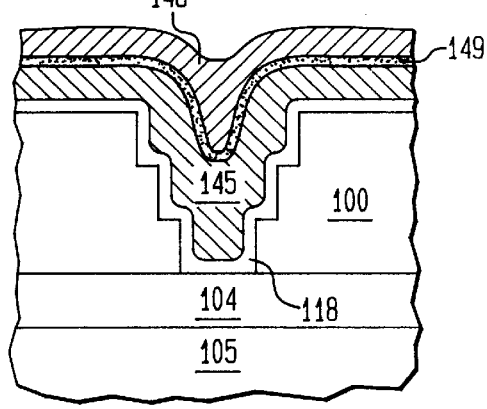
FIG. 18 is a cross section showing another exemplary embodiment of the structure of the present invention including a spacer film beneath the tungsten film.

FIG. 18 shows an alternate embodiment of the structure of FIG. 17 which includes a spacer material 149 formed sequentially after the bulk conductive film 145 and before the tungsten film 148. The spacer materials such as tungsten nitride or the nitrides of titanium or tantalum may be formed using conventional processes such as CVD or PVD to produce spacer material 149 interposed between tungsten film 148 and bulk conductive film 145.

Figure 19:
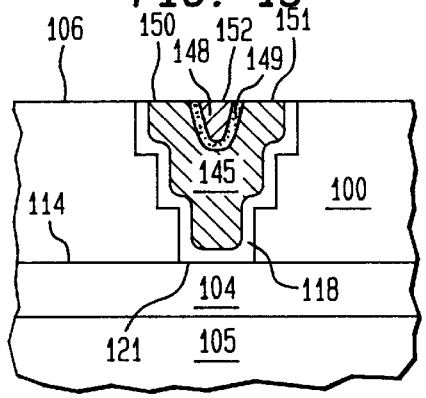
FIG. 19 is a cross section showing an exemplary embodiment of the structure of the present invention after it has been polished.

FIG. 19 shows the structure of FIG. 18 after the structure has been polished. Although the device shown has been formed in the terraced trench 110, as shown in FIG. 15, it is understood that this device can alternatively be formed within a terraced trench which includes a capping film (as described in conjunction with FIGS. 3A through 3F) or a collar film (as described in conjunction with FIGS. 4C through 4G). During the polishing process, when a capping film is used, the capping film will remain after polishing as shown in conjunction with FIG. 14. When a collar film is used, after polishing, the collar film will remain within the terraced trench and will be disposed along the side walls of the upper vertical section, and may also remain on the top surface after polishing—depending on the materials used to form the collar film.

The structure shown in FIG. 19 includes the barrier-adhesion film 118 and the bulk conductive film 145. The tungsten film 148 is also included as a core region. The tungsten is capable of carrying a current and preventing device failure should the bulk conductive film fail due to electromigration or other problems. In one embodiment, the spacer film 149 is included between the tungsten film 148 and the bulk conductive film 145. In the preferred embodiment, the bottom trench surface 121 is formed as part of upper surface 114 of contact film 104 to expose the contact film 104. The upper surface 150 of the structure is substantially continuous with the top surface 106 of the dielectric film 100. The upper surface 150 is polished and has a central region 152 including tungsten and adjacent regions 151 which lie outside of the tungsten core and are comprised of the bulk conductive film 145.

Figure 20:
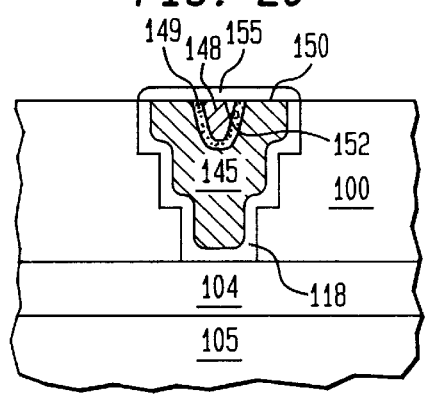
FIG. 20 is a cross section showing another embodiment of the structure of the present invention after it has been polished.

FIG. 20 shows an alternative embodiment of the example shown in FIG. 19. In this embodiment, the polished surface 150, which includes the tungsten core central region 152, is capped by a film 155 formed using selective deposition processes. Any electroless deposition process which selectively forms a film over an exposed metal surface can be used. In the preferred embodiment, film 155 may comprise cobalt tungsten (CoW), but may also comprise cobalt phosphorus (CoP) or cobalt tungsten phosphorus (COWP) in other exemplary embodiments.

Although illustrated and described above with reference to certain specific examples, the present invention is nevertheless not intended to be limited to the details shown. Rather, various modifications may be made to the details within the scope and range of equivalents of the claims and without departing from the spirit of the invention. The number of vertical sections included within the terraced trench produced according to the present invention, and the relative height and width of each section, may be varied.

Modifications to the interconnection device film structure formed within a trench encompass, for example, the inclusion or exclusion of the various films described with respect to the exemplary structures. In addition, structural films such as the capping film and the collar layer may be used depending on the specific application. The interconnection structures of the present may be inlaid within any suitable structure.

What is claimed:

1. A process for forming a connection device, comprising the steps of:
    (a) forming a contact layer over a substrate, said contact layer having a contact surface;
    (b) forming a dielectric film over said contact surface, said dielectric film having a top, a bottom, and an upper surface;
    (c) forming a terraced trench opening within said dielectric film, said terraced trench opening having a trench bottom surface and at least three adjoining vertical sections, each vertical section having at least one generally vertical side wall and being connected to an adjoining vertical section by a substantially horizontal lip, the vertical sections becoming progressively wider from bottom to top of the dielectric film;
    (d) forming a barrier film at least within said terraced trench opening;
    (e) depositing a tungsten liner film at least over said barrier film;
    (f) forming a spacer film over said tungsten liner film, said spacer film comprising one of titanium nitride and hexagonal tantalum nitride;
    (g) forming a copper seed layer over said spacer film;
    (h) filling said terraced trench opening with a conductive film comprising electrodepositing; and
    (i) polishing said device thereby forming a polished surface over said terraced trench opening, said polished surface being substantially parallel to said upper surface of said dielectric film.

2. The process as in claim 1, in which said step (c) includes exposing a portion of said contact surface through said trench bottom surface of said terraced trench opening, wherein said trench bottom surface comprises said portion of said contact surface.

3. The process as in claim 1, wherein said step (e) of depositing comprises chemical vapor deposition.

4. The process as in claim 1, wherein said terraced trench opening has an average aspect ratio of 4.2 or greater.

5. The process as in claim 1, wherein said step (d) comprises depositing at least one film selected from the group of films consisting of $Si_3N_4$, $SiO_2$, $Al_2O_3$, Ti, Ta, TaW, TiN, and hexagonal TaN.

6. The process as in claim 1, wherein said step (d) comprises the steps of forming a Pd film using electroless deposition processes, then forming a CoP film over said Pd film using electroless deposition processes.

7. The process as in claim 1, in which said step (d) includes forming a continuous barrier film covering said upper surface, said side walls, said lips, and said trench bottom surface.

8. The process as in claim 1, further comprising including a nitrogen source toward the end of said step (e) of depositing.

9. The process as in claim 1, wherein said barrier film is discontinuous toward said trench bottom surface of said terraced trench opening, and wherein said step (e) of depositing a tungsten liner film includes forming said tungsten liner film over portions of said side walls, said lips, and said trench bottom surface not covered by said barrier film.

10. The process as in claim 1, in which step (e) includes forming a spacer film over said tungsten liner film, said spacer film comprising one of titanium nitride and hexagonal tantalum nitride.

11. The process as in claim 1, wherein said conductive film is copper.

12. The process as in claim 1, wherein said conductive film is an aluminum film.

13. The process as in claim 1, wherein said step (g) of polishing comprises chemical mechanical polishing.

14. The process as in claim 1, wherein said step (c) comprises sequentially etching a plurality of openings within said dielectric film, each opening having an associated width and a common center point, wherein the width of each sequentially etched opening is greater than the width of the previously etched opening.

15. The process as in claim 1, wherein said contact layer is an electrically conductive material.

16. The process as in claim 1, in which said step (b) includes forming a capping film on said upper surface of said dielectric film, said capping film having a capping surface and wherein said polished surface is substantially continuous with said capping surface.

17. The process as in claim 16, wherein said capping film comprises one of $Al_2O_3$ and silicon nitride.

18. A process for forming a connection device, comprising the steps of:
    (a) forming a contact layer over a substrate, said contact layer having a contact surface;
    (b) forming a dielectric film having a top, a bottom, and an upper surface over said contact surface;
    (c) forming a terraced trench opening within said dielectric film, said terraced trench opening having a trench bottom surface and at least two adjoining vertical sections, each vertical section having a generally vertical side wall and being connected to an adjoining vertical section by a substantially horizontal lip, the vertical sections becoming progressively wider from bottom to top;

(d) forming a barrier film at least within said terraced trench opening;

(e) depositing a bulk conductive film over said barrier film, said bulk conductive film partially filling said terraced trench opening;

(f) filling said terraced trench opening with a film including tungsten;

(g) polishing to produce a polished surface substantially continuous with said upper surface, said polished surface comprising a central portion comprised of said tungsten and at least one further section comprised of said bulk conductive film.

19. The process as in claim 18, wherein said bulk conductive film is aluminum.

20. The process as in claim 18, wherein said bulk conductive film is one of gold and nickel.

21. The process as in claim 18, further comprising the step (h) of selectively depositing one of a cobalt tungsten film, a cobalt phosphorus film, and a cobalt tungsten phosphorus film over said polished surface.

22. The process as in claim 18, wherein said contact layer is an electrically conductive material.

23. The process as in claim 18, in which said step (c) includes exposing a portion of said contact surface through said trench bottom surface of said terraced trench opening, wherein said trench bottom surface comprises said portion of said contact surface.

24. The process as in claim 18, further comprising the step (d1) of forming a copper seed layer film over said barrier film and wherein said step (e) comprises electrodepositing.

25. The process as in claim 18, further comprising the step (e1) of forming a spacer film over said bulk conductive film.

26. The process as in claim 23, wherein said step (c) comprises the steps of:

(c1) creating a first pattern in a first photosensitive film, said first pattern including a first opening having a first width, said first opening exposing a first portion of said dielectric film;

(c2) etching said first portion of said dielectric film to a first depth thereby forming a trench opening within said dielectric film, said trench opening including a landing and upper side walls;

(c3) removing said first photosensitive film;

(c4) forming a collar film on said upper surface and covering said landing and said upper side walls;

(c5) creating a second pattern in a second photosensitive film, said second pattern including a second opening having a second width less than said first width, said second opening exposing a first area of said collar film disposed on said landing;

(c6) etching through said first area of said collar film and etching said dielectric film to a second depth greater than said first depth, thereby forming said trench bottom surface; and (c7) removing said second photosensitive film;

wherein said trench opening comprises said terraced trench opening.

27. The process as in claim 24, wherein said bulk conductive film is copper.

28. The process as in claim 26, wherein the collar film includes at least one of an insulating film and a conductive film.

29. The process as in claim 26, wherein said collar film comprises a film selected from the group of films consisting of SiN, $SiO_2$, $Al_2O_3$, Ti, Ta, TiW, and TaW.

30. The process as in claim 25, wherein said spacer film comprises a nitride of one of tungsten, titanium, and tantalum.

31. A process for forming a connection device, comprising the steps of:

(a) forming a contact layer over a substrate, said contact layer having a contact surface;

(b) forming a dielectric film over said contact surface, said dielectric film having a top, a bottom, and an upper surface;

(c) forming a terraced trench opening within said dielectric film, said terraced trench opening having a trench bottom surface and at least three adjoining vertical sections, each vertical section having at least one generally vertical side wall and being connected to an adjoining vertical section by a substantially horizontal lip, the vertical sections becoming progressively wider from bottom to top of the dielectric film, said step of forming a terraced trench comprising the steps of:

(c1) creating a first pattern in a first photosensitive film, said first pattern including a first opening with a first width, said first opening exposing a first portion of said dielectric film;

(c2) etching said first portion of said dielectric film to a first depth thereby forming a trench opening within said dielectric film, said trench opening including a landing and upper side walls;

(c3) removing said first photosensitive film;

(c4) forming a collar film on said upper surface and covering said landing and said upper side walls;

(c5) creating a second pattern in a second photosensitive film, said second pattern including a second opening with a second width less than said first width, said second opening exposing a first area of said collar film disposed on said landing;

(c6) etching through said first area of said collar film and etching said dielectric film to a second depth greater than said first depth, thereby enlarging said trench opening and forming a bottom surface within said dielectric film;

(c7) removing said second photosensitive film;

(c8) creating a third pattern in a third photosensitive film, said third pattern including a third opening with a third width greater than said second width but less than said first width, said third opening exposing said bottom surface of said dielectric film and a second area of said collar film disposed on said landing;

(c9) etching through said second area of said collar film and etching said dielectric film to a third depth greater than said second depth thereby exposing a portion of said contact surface through said trench bottom surface of said terraced trench; and (c10) removing said third photosensitive film; wherein said first opening, said second opening, and said third opening have a common center point and said trench opening comprises said terraced trench opening;

(d) forming a barrier film at least within said terraced trench opening;

(e) depositing a tungsten liner film at least over said barrier film;

(f) filling said terraced trench opening with a conductive film; and (g) polishing said device thereby forming a polished surface over said terraced trench opening, said polished surface being substantially parallel to said upper surface of said dielectric film.

32. The process as in claim 31, wherein said step (c4) comprises depositing at least one film selected from the group of films consisting of $Si_3N_4$, $SiO_2$, $Al_2O_3$, Ti, Ta, TaW, TiN, and TaN.

33. A process for forming a connection device, comprising the steps of:
(a) forming a contact layer over a substrate, said contact layer having a contact surface;
(b) forming a dielectric film over said contact surface, said dielectric film having a top, a bottom, and an upper surface;
(c) forming a terraced trench opening within said dielectric film, said terraced trench opening having a trench bottom surface and at least three adjoining vertical sections, each vertical section having at least one generally vertical side wall and being connected to an adjoining vertical section by a substantially horizontal lip, the vertical sections becoming progressively wider from bottom to top of the dielectric film;
(d) forming a barrier film at least within said terraced trench opening comprising depositing at least one film selected from the group of films consisting of $Si_3N_4$, $SiO_2$, $Al_2O_3$, Ti, Ta, TaW, TiN, and hexagonal TaN.;
(e) depositing a tungsten liner film at least over said barrier film;
(f) filling said terraced trench opening with a conductive film; and
(g) polishing said device thereby forming a polished surface over said terraced trench opening, said polished surface being substantially parallel to said upper surface of said dielectric film.

34. A process for forming a connection device, comprising the steps of:
(a) forming a contact layer over a substrate, said contact layer having a contact surface;
(b) forming a dielectric film over said contact surface, said dielectric film having a top, a bottom, and an upper surface;
(c) forming a terraced trench opening within said dielectric film, said terraced trench opening having a trench bottom surface and at least three adjoining vertical sections, each vertical section having at least one generally vertical side wall and being connected to an adjoining vertical section by a substantially horizontal lip, the vertical sections becoming progressively wider from bottom to top of the dielectric film;
(d) forming a barrier film at least within said terraced trench opening;
(e) depositing a tungsten liner film at least over said barrier film and forming a spacer film over said tungsten liner film, said spacer film comprising one of titanium nitride and hexagonal tantalum nitride;
(f) filling said terraced trench opening with a conductive film; and
(g) polishing said device thereby forming a polished surface over said terraced trench opening, said polished surface being substantially parallel to said upper surface of said dielectric film.

\* \* \* \* \*